United States Patent [19]

Behrens et al.

[11] Patent Number: 5,499,248

[45] Date of Patent: Mar. 12, 1996

[54] TEST VECTOR GENERATOR COMPRISING A DECOMPRESSION CONTROL UNIT AND A CONDITIONAL VECTOR PROCESSING UNIT AND METHOD FOR GENERATING A TEST VECTOR

[75] Inventors: Klaus-Peter Behrens, Gaertringen; Martin Fischer, Heilbronn; Thomas Henkel, Boeblingen, all of Germany

[73] Assignee: Hewlett-Packard Company, Palo Alto, Calif.

[21] Appl. No.: 189,200

[22] Filed: Jan. 31, 1994

[30] Foreign Application Priority Data

Feb. 23, 1993 [DE] Germany .......................... 43 05 442.0

[51] Int. Cl.[6] ............................................. G01R 31/3183
[52] U.S. Cl. ........................... 371/22.1; 371/21.1; 371/27
[58] Field of Search ................................... 371/22.1, 21.1, 371/15.1, 27; 364/481, 579, 580; 324/761, 765, 555, 73.1

[56] References Cited

U.S. PATENT DOCUMENTS

| | | | |
|---|---|---|---|
| 4,517,661 | 5/1985 | Graf et al. | 371/27 |
| 4,583,223 | 4/1986 | Inoue et al. | 371/22.1 |
| 4,639,919 | 1/1987 | Chang et al. | 371/27 |
| 4,931,723 | 6/1990 | Jeffrey et al. | 324/73.1 |
| 4,989,209 | 1/1991 | Littlebury et al. | 371/22.1 |
| 5,001,418 | 3/1991 | Posse et al. | 324/73.1 |
| 5,025,205 | 6/1991 | Mydill et al. | 324/73.1 |
| 5,072,178 | 12/1991 | Matsumoto | 371/22.1 |
| 5,127,011 | 6/1992 | Combs et al. | 371/22.1 |
| 5,212,443 | 5/1993 | West et al. | 324/73.1 |

FOREIGN PATENT DOCUMENTS

0474275A2  3/1992  European Pat. Off. .
0474274A2  3/1992  European Pat. Off. .

OTHER PUBLICATIONS

German Search Report of corresponding application No. P 43 05 442.0–35, dated Nov. 26, 1993.

*Primary Examiner*—Emanuel T. Voeltz
*Assistant Examiner*—Kyle J. Choi

[57] ABSTRACT

An apparatus for testing an electronic device, in particular an integrated circuit tester and specifically designed for testing memories or logic/memory combinations, provides a multiplicity of pin channels. Each pin channel includes a sequence controller communicating with a decompression control unit. This combination is extremely fast and allows to designate the respective pin channels to an address or a data pin of a memory or to a logic pin of a device under test. A central controller provides the necessary control instructions to instruction memories of the sequence controllers. All sequence controllers assigned to a logic pin execute basically the same program, wherein pin adaptation is performed by a vector memory. In contrast, sequencers assigned to an address pin execute different, pin-specific instructions. The architecture may be easily adapted to varying pin definitions and is based on the "per pin resource" approach. It may also be applied to board testers and other electronic testing devices.

33 Claims, 8 Drawing Sheets

TEST VECTOR GENERATOR COMPRISING A DECOMPRESSION CONTROL UNIT AND A CONDITIONAL VECTOR PROCESSING UNIT AND METHOD FOR GENERATING A TEST VECTOR

FIELD OF THE INVENTION

The present invention relates to an apparatus for testing an electronic device having at least one terminal, said apparatus including at least one terminal channel assigned to said terminal, or to a specific set of terminals. In more general terms, the invention relates to the structural concept used in an integrated circuit tester (IC tester), in a board tester, or like tester circuitry. In case of integrated circuit testers, the invention deals particularly with those designed to test memories, or integrated components with logic and memory functions, such as ASICs.

BACKGROUND OF THE INVENTION

Although the present invention deals with all kind of testers for electronic devices, the associated problems which form the basis of the present invention will first be discussed for the case of integrated circuit testers.

Integrated circuit testers are, in general, provided to test the functionality of IC's prior to their insertion or installation in an assembly, such as soldering on a printed circuit board. If any malfunction of an IC were only detectable on the board level (e.g., by a board tester), there would be a need to throw away the complete board, or at least the need for costly measures would arise, such as removal of the defective IC. Thus, integrated circuit testers ensure that defective IC's are detected in an early stage of assembly. This aspect is becoming more and more important with increasing integration, i.e., increasing package density of semiconductor chips.

In the past, different concepts have been used to test integrated circuits containing logic circuitry, and integrated circuits containing memories. The first group of devices has often been referred to as "LSI testers", whereas the latter group has been referred to as "memory testers".

Another approach to classify integrated circuit testers is by their internal structure. Two general concepts are known in the art, namely the "shared resource" approach and the "distributed resource" or "per pin resource" approach.

It is important to note that integrated circuit testers comprise logic circuitry which is dedicated to a specific terminal (pin) of the device to be tested (the so-called "Device under Test" or "DUT"). In other words, the same kind of logic circuitry exists multiple times in an IC tester, once for every pin of the DUT. If the IC tester is set up to test DUT's with a given maximum n of pins, this means that the pin circuitry has to be provided n times: n can approximate several hundred or even exceed some thousand, in view of state-of-the-art semiconductor chips and the related packaging technology.

The pin circuitry (pin channel or terminal channel) commonly comprises driver circuits for the assigned pin, and mostly also formatter and comparator circuits. The latter are circuits which combine data and timing information (formatter), or test a signal received from the assigned terminal for its timing and correct logic state (comparator). Reference is made to EP-B-329 798 and European Patent Application . . . (application number: 91119190.6) which disclose formatters of the kind discussed herein, and to DE-C-33 46 942, EP-B-325 670 and European Patent Application . . . (application number: 91119165.8), as far as comparators are concerned.

However, there is also circuitry which has not necessarily to be assigned to every pin of the DUT, like various control circuits. "Shared resource" in this context means that the control circuitry, or part thereof, is shared between multiple pins. For example, the control circuitry may be provided only once, and communicate with the pin channels (terminal channels) via a common bus. This eliminates the need to replicate the control circuit for every pin of the DUT. However, it implies several design constraints, particularly speed constraints.

In contrast, the "per pin resource" approach provides control circuitry, or at least the speed-critical part thereof, for every pin channel. This approach may overcome the above speed restrictions; however, it may be very expensive as the control circuitry has to be provided n times. Sometimes even the speed of a "per pin" resource does not fit the requirements of a particular application.

In the case of classic memory testers, a central algorithmic pattern generator (APG) has been provided (as a shared resource for all pin channels). The APG was an extremely complex and costly device, consisting of several PC boards or at least customized IC's (ASICs). Typically, it provided a first generator for the x addresses of the DUT, a second generator for the y addresses, a (third) data generator and a controller. Their operation can be illustrated by the creation of a zero pattern in the DUT. In this case, the data generator would generate a permanent "0". The X address generator would run from "0" to a predefined end address, whereas the y address generator would keep its value. As soon as the x address generator would reach its end address, it would be reset to "0"; the y address generator would be increased by one, and the x address generator would again run from "0" to its end address. The whole process would go on until all cells of the memory under test contained a "0".

The controller of such a prior art APG includes a programmable memory which contains the sequences to be generated, or a program which generates such sequences.

A tester designed essentially according to the "shared resource" approach is, for example, disclosed in U.S. Pat. No 4,450,560.

It is understood that, due to the interconnection of the control signals and the propagation delay times caused thereby, an APG of conventional design can operate only at limited speed. This applies even if very fast and expensive APG's are used, as has been common practice in the prior art.

Thus, prior art memory testers using the "shared resource" concept do not fit the need to test memories at acceptable speed. This applies particularly as the capacity of memories is increasing, and as there is a need to increase the rate of testing.

Another problem arises as more and more integrated circuits contain logic circuitry, as well as memories, on the same chip. This applies particularly to customized IC's such as ASICs. It would hardly be possible to test such devices with prior art IC testers designated specifically to memory or logic test in a given time frame. Even a combined tester incorporating memory and logic test circuitry would not fit those needs: Such a tester would have to provide different circuitry for pins designated as logic pins, as compared to pins designated as memory pins. However, as the designation of an ASIC's pin is not predefined, and as different ASICs have different pin designations, there would be an ongoing need to exchange or rearrange the pin channels, and their connection to a central resource. Even worse, there are integrated circuit devices which change their pin definition during operation. Such a device could not be tested with a combined memory/IC tester at all.

The above-mentioned U.S. Pat. No. 4,450,560 discloses an approach for a combined logic/memory tester wherein a switch is provided for switching between the two modes. However, this switch is complex and expensive and reduces operating speed. Speed is further reduced as this prior art tester uses the "shared resource" concept. Furthermore, the prior art tester is not able to deal with changing pin definitions within acceptable time limits.

In this context, it is important to note that prior art logic testers (LSI testers) are based on a different concept, as compared to memory testers. A so-called sequencer (basically a counter with some additional control circuitry, such that it can perform jumps, subroutines etc.) generates addresses which are fed to a memory. The memory—which is referred to herein as "Vector Memory"—decodes the addresses and feeds the data stored at the corresponding addresses to a pin-specific circuitry, usually called "formatter/comparator" circuit. The formatter processes the data received from the Vector Memory and links them with timing information, usually produced by edge generators. Likewise, the comparator checks data produced by the DUT for their accuracy in timing, as well as their correct logic state. Both the formatter and the comparator are connected with a single pin of the device under test.

A more advanced approach of decoding the sequencer addresses is described in European Patent Application . . . (application no. 91119189.8), which is fully incorporated herein by reference. The concept disclosed in this document uses an additional memory, called "Waveform Memory", to decode the output of the Vector Memory into a variety of actions, such that a multiplicity of operations on the DUT is possible, and wherein the definition of such actions may easily be changed by simply replacing the contents of the Waveform Memory. By the way, the Vector Memory/Waveform Memory approach may also be used in the present invention (see discussion below).

Prior art logic testers used the shared resource approach as well; i.e., the sequencer has been provided as a central resource, whereas the Vector Memories, the formatters and the comparators were provided per pin. This concept was subject to the same limitations in timing, as was the case for memory testers using the shared resource concept. Thus, logic testers based on the "per pin" approach have also been developed. That is, a specific sequencer has been provided for every pin channel. The various "pin" sequencers were all identical, i.e., executed the same program. The adaptation to the specific pin was performed by different data stored in the respective Vector Memories. This concept was commercially successful because a sequencer is a relatively simple and inexpensive unit, such that even a multiplicity of sequencers did not considerably increase the overall price of the logic tester.

However, all of these prior art solutions were not suited for a combined IC tester which should, by definition, be able to test mixed logic/memory circuitry, such as the above described ASICs, reliably and quickly, even when pin definitions change over time or from IC to IC. Consequently, there is a need for such a tester.

Likewise, there is an ongoing need for a memory tester which operates faster than prior art memory testers, at a reasonable price. The present invention focuses on solutions for both underlying problems.

It would also be desirable to have a logic tester which operates faster, and requires less hardware, than prior art logic testers.

It will be appreciated that similar problems exist in the field of board testers and other electronic device testing equipment. Board testers, for example, are provided either to test blank boards—i.e., unloaded boards wherein only the electrical connections are of interest—, or loaded boards. Whereas the first case is trivial, the second requires extensive testing circuitry, as the components on the boards may fulfil a variety of functions. It will be appreciated that a board tester in this sense may be even more complex than an integrated circuit tester, as a board may be loaded with components of different technology, e.g., digital logic circuitry, memories, analog circuitry and the like. Thus, there is also a need for a board tester which is sufficiently fast and can test all the functions on the board, at a reasonable price.

It will be understood that the present invention focuses also on related electronic device testers, such as board testers, ASIC testers, and so on.

SUMMARY OF THE INVENTION

The above drawbacks are overcome, and related advantages are obtained, in an apparatus of the kind disclosed above which comprises the following features:

a sequence controller for generating a first sequence of vectors, at least one decompression control unit which is controlled by the sequence controller, generates decompressed signals and feeds them to the sequence controller, wherein said sequence controller further includes conditional vector processing means for generating a second sequence of vectors in dependence of the first sequence of vectors, and independence of the decompressed signals received from the decompression control unit.

In order to explain the concept, and the features making up this invention, it may be useful to consider the way it was actually made.

There had been a need for a combined logical/memory tester which did not need any complex and expensive hardware to switch between LSI and memory test data. Similar requirements existed for a memory tester as such.

One approach which has been considered by the inventors was to use the "per pin" approach in a memory tester as well. This would mean that an APG (Algorithmic Program Generator) had to be provided per pin channel (similar to the "per pin" approach in a logic tester wherein a sequencer is provided for every pin). However, it was noted that there are two basic constrains which limit the applicability of this concept:

First, a sequencer is a relatively cheap component which can easily be provided multiple times. In contrast, the APG required for memory testing is extremely complex and expensive, such that a tester incorporating several hundreds of conventional APG's could hardly be commercialized. This is partially due to the fact that a sequencer generates single addresses only which are useful for all the "per pin" Vector Memories in a logic tester, whereas an APG generates x and y addresses for all cells of a memory, although in a "per pin" architecture, only a single bit would be required. In other words, a "per pin APG" structure would result in an enormous overhead.

Second, it will be noted that even the provision of an APG per pin of the DUT (Device Under Test) would not solve the problem of testing DUTs with combined logic/memory functionality. The test of logic/memory devices illustrates a further disadvantage of the "APG per pin" philosophy: That is, an APG had to be provided for every pin, although most of the pins of such combined devices are usually logic pins. However, as pin definition may change, either from ASIC to ASIC or even during operation, there would be a need to provide an APG still for every pin, simply because of the possibility that the assigned pin might also be operated as a memory pin in certain situations. The latter considerations illustrate further the overhead generated by the "APG per pin" concept. Thus, memory or logic/memory testers based on the "APG per pin" concept could hardly be commercialized, due to the hundreds or thousands of APGs required.

One solution to overcome the problem of testing combined logic/memory devices—which was actually under consideration before the present invention was made—is to provide separate logic and memory testers, and to use a switch matrix which links the signals generated, and received by the logic tester and the memory tester. However, such a switch matrix had to be extremely large, due to the required pin count (thousands of pins). A further requirement of the switch matrix is very high speed. It is doubtful whether a switch matrix meetings these needs could be produced with today's technology, and even if it were possible, it could hardly be commercialized, due to its overwhelming cost.

The present invention is based on novel and unconventional considerations to solve the underlying problems. According to the invention, a sequence controller is provided for generating a first sequence of vectors. This sequence controllers may be of conventional design; i.e., it is a relatively straight forward and cheap component.

Assigned to the sequence controller is a decompression control unit which is controlled by the sequence controller, generates decompressed signals and feeds them to the sequence controller. This is a first major feature distinguishing the present invention over the prior art. In general, the decompression control unit receives control signals, or control patterns, from the sequence controller. These control signals are processed by the decompression control unit, preferably basically independent of the sequence controller. One example of such independent operation is that the decompression Control unit runs with its own clock, such that the sequence controller, once it has loaded the decompression control unit with the start-up parameters, has not to perform any supervisory tasks relating to the decompression control unit. The decompression control unit thus prepares signals (the meaning of which will be discussed below) and relieves the sequence controller from the related operations.

The sequence controller further includes conditional vector processing means. The first sequence of vectors generated by the sequence controller is fed to this conditional vector processing means, as well as the decompressed signals received from the decompression control unit. The conditional vector processing means now generates a second sequence of vectors, in dependence of the signals fed to it, namely the first sequence of vectors, as well as the decompressed signals.

A typical example of this kind of operation is when the first sequence of vectors consists of two or more different sub-sequences which are generated simultaneously. The decompressed signal determines which of said sub-sequences is fed to the output of the sequence controller. Formally, this corresponds to an instruction like "move A or B to output dependent on C", wherein A and B are the sub-sequences, and C is the decompressed signal. Of course, the conditional vector processing means may also perform other or related functions, such as gating the first sequence of vectors, performing any kind of logic combination between the first sequence of vectors and the decompressed signal, and the like.

The basic advantage of this structure is a considerable increase in speed, at virtually no additional costs other than those for the decompression control unit (which may be of quite simple design). In particular, a sequence controller of basically the same or similar structure as known sequencers may be used. The decompression control unit relieves the sequence controller from some time-consuming tasks such as address generation (see discussion below). In fact, the sequence controller has to provide only the necessary startup conditions, and may further, from time to time, feed additional control information to the decompression control unit, in order to influence its operation. However, operation of the decompression control unit consumes basically no computational or logic power of the sequencer. In other words, the decompression control unit is basically self-operating and needs only some control information which defines the boundary conditions. By the way, it should be noted that, although the decompression control unit may be a separate component, it can also be integrated with the sequence controller, e.g., on the same chip.

In an important and preferred embodiment, the decompression control unit expands control signals received from the sequence controller to decompressed signals. Further, the conditional vector processing means may execute instructions with a conditional operand, wherein the condition of said conditional operand is set by the decompressed signals received from the decompression control unit.

As already discussed above, the invention is particularly suited for application in an integrated circuit tester. In one particularly preferred embodiment of the invention, the integrated circuit contains at least a memory section and has a multiplicity of terminals or pins, wherein at least a first subset of said pins is at least temporarily operative as address pins, and at least a second subset of said pins is at least temporarily operative as data pins. This wording includes integrated circuits which are mixed logic/memory circuits, as well as pure memories, or pure logic.

In this embodiment, a terminal channel of the kind discussed at the outset may preferably be provided for essentially all pins of the second subset of pins, i.e., for the address pins. In other words, a sequence controller, including the associated decompression control unit, is provided essentially for all address pins. However, it is understood that terminal channels of the kind discussed above may also be provided for other pins, such as data pins, control pins, logic pins, analog pins and the like.

Operation of such an integrated circuit tester with the provision of a sequence controller and a decompression control unit per address pin (or for all pins) may be described as follows:

Operation of the decompression control unit is focused on the fast generation of addresses, data, control bytes, and the like which would require a considerable amount of computational time if performed in the sequence controller. Basically, the decompression control unit uses the startup and boundary conditions set by the sequencer to generate a train of complete (i.e., expanded) signals such as addresses.

Examples of decompression control units are address generators, data generators, control byte generators, status byte generators and the like. Some of these, in particular the address generator, will be discussed in more detail below.

The decompression control unit feeds the decompressed signals back to the sequencer, thus relieving the sequencer from the basically simple, but very time-consuming task of generating the vectors required to operate on the assigned pin of the DUT. Thus, the sequencer is able to control the assigned pin in real time even at very high testing speed. It is just this very concept which makes the inventive "multiple sequencer" structure suited for memory testing.

However, it should be noted that there are further differences to the "multiple sequencer" approach, as it has been used in prior art logic testers. It has been explained above that, in the known logic tester "per pin" concept, all sequencers execute basically the same program (or microprogram). This is in contrast to the present invention, wherein the sequencers execute, at least in memory test mode, different programs, namely programs which are specifically adapted to the assigned pin of the DUT.

One could thus also say that the unique sequencer/ decompression control unit combination according to this invention constitutes, in effect, a partial APG, namely an APG adapted to a specific pin of the DUT. In fact, the decompression control unit according to the invention generates preferably 1-bit information, in particular a 1-bit address, which is fed back to the sequencer (although the invention is not limited to this aspect). The sequencer operates preferably also in 1-bit mode, as it has to control a single pin only. This makes its operation very fast, particularly as signal decompression (e.g., address generation) is performed by fast hardware and thus requires no extra computational time to be spent by the sequencer.

It has turned out that the above disclosed tester concept fits the needs of memory testing extremely well. Thus, the invention establishes a new kind of memory tester. In fact, it is suited to test integrated circuit devices which contain only memories at very high speed. It does not need a multiplicity of expensive hardware, like the above discussed switch matrix or an APG per pin, such that it may be sold at attractive pricing.

It has further turned out that the underlying concept is not only ideally suited to perform memory testing, but logic testing as well, and even both in combination (The latter aspect is of particular importance for integrated circuits containing both kinds of circuitry, like the above-discussed ASICs). This is because the sequencer is also able to perform the function of a logic tester sequencer, i.e., to feed test patterns to logic pins, just like prior art sequencers in logic testers did it is this two-fold function which allows to connect a pin circuitry according to the invention to any arbitrary pin of a device under test, even without prior knowledge about the functionality (address pin, data pin, logic pin etc.) of this specific pin. The pin may even change its definition during operation and can still be tested.

There is particularly no need—as in prior art devices—to alter the interconnection (and the connection to a central source) of the pin circuitry when a pin changes its definition. Likewise, an expensive and slow switch (as required in a tester according to U.S. Pat. No. 4,450,560 to switch between memory testing mode and logic testing mode) is avoided.

It has been explained above that, in memory test mode, the various sequencers all execute different programs, in dependence of their assigned pin. However, in logic test mode, they may all execute the same program (as in prior art logic testers), although this is not a necessary condition for practicing the present invention. However, in a preferred embodiment of the invention, a Vector Memory (decoder memory) is provided, in which case all sequencers may execute the same program, provided their respective Vector Memories have been loaded with data specific to the assigned pin. This embodiment has the advantage that the Vector memories may be easily reloaded in case a pin changes its definition, either during operation of an IC, or between different IC's. In another preferred embodiment, the invention also features a second memory (the Waveform memory), as disclosed in European Patent Application . . . (application no. 91119189.8), with the advantages described in this document.

In still other advantageous embodiments, formatter/comparator circuits of the kind described above are interconnected between the sequence controller and the assigned pin of the DUT, or a buffer (preferably a first-in-first-out memory) is provided between the sequence controller and the decoder memory.

There is yet another aspect which illustrates the universal applicability of the present invention. This is that the pin channels (pin circuits) according to the invention may not only be used to drive the address pins (in memory testing mode, or if set up for pure memory testing), or the logic pins (in logic testing mode) of the device under test. In contrast, it may be used to drive data pins (in memory test mode), control pins (in either mode) and basically any other kind of pin of the DUT as well!

Therefore, an integrated circuit tester may be set up such that it drives basically all pins of the DUT, regardless of their functionality, with the same circuitry, namely with pin driver circuits according to this invention. It will be appreciated that this makes hardware configuration, storage keeping etc. particularly easy (and inexpensive), as only one kind of pin driver has to be provided. However, it will be understood that the present invention covers also cases wherein only a specific subset of the pins, e.g. only the data pins, of a DUT are driven by the inventive pin circuitry.

In a preferred embodiment of the invention, a central controller is provided which is connected with essentially all of the sequence controllers, said central controller controlling the contents of an instruction memory which is part of every sequencer. The controller may be set up to synchronize the various pin channels, provide control information to the "per pin" sequencers, collect test results etc.; however, it will not be actually involved in the time-critical test sequences which are performed locally.

Further, in another advantageous embodiment of the invention, the central controller may be adapted to load each sequence controller's instruction memory with instructions specifically dedicated to its assigned pin. This is an important feature to increase the variability of the tester. In particular, the central controller may easily exchange, i.e., download, the instruction sets in the memories of the various sequencers in case a pin definition changes.

In the case of memory testing, the central controller may also be programmed to generate different instructions from an overall test procedure for every assigned pin. That is, the "overall" test pattern is only known to the central controller, which transforms it into a multiplicity of simpler, pin-dedicated test programs which are then downloaded to and executed by the sequencers.

Thus, in the preferred embodiment of the invention, a sequence controller is assigned to basically every pin of the DUT, at least to those pins which may permanently or from time to time, be operated as address pins. The sequence controllers may be basically of the same or similar structure as known sequencers. This is a novel approach for a memory or logic/memory tester, although already known in pure logic testers. It is also surprising because nobody skilled in the art would have expected that a sequencer, although designed to generate addresses for logic testing, could be useful for memory testing as well.

In fact, using a sequencer alone would not fit the needs, as it would not be able to generate and control memory addresses at the required speed. This directs attention to the decompression control unit which may e.g. generate addresses (and/or other digital signals, such as data, as well) basically without external control.

It is understood that the above concept of distributed terminal channels and a central controller may also be expanded to other testers than integrated circuit testers.

The decompression control unit according to the invention may be, or include, an address generator (in particular a 1-bit address generator). Such address generators may, for example, feature a frequency divider (e.g., flip-flops with a feedback loop), shift registers and the like. However, in the most preferred solution, at least one counter (or a chain of counters) is provided.

Reference is now made to the most common test patterns for memories (or IC's with mixed memory/logic structure).

One of the most simple test patterns used in memory testing is the so-called "N-pattern". One example is a pattern which is written into the memory (N address generation cycles, wherein N is the total number of memory cells), and is thereafter read and checked for accuracy (another N address generation cycles). That is, we have a total number of 2N address generation cycles.

This is a task which can ideally be performed by a counter. It is once preset and started by the sequencer and delivers then all addresses needed during the N-pattern test on an automatic basis.

Another, more sophisticated way of memory testing is the so-called "$N^2$-pattern". It uses a concept of "home cells" and "away cells". For example, the content of one cell in the memory (the home cell) is held constant, whereas all other cells in the memory (the away cells) are varied, in order to check whether the contents of the home cell are influenced by any transition in the away cells. This process is continued until all cells of the memory have operated as "home cells" once. One can also reverse this concept, i.e., hold all but one cell in the memory at a constant value (the home cells) and vary the content of the remaining cell (the away cell), in order to check whether this variation has caused any transitions in the home cells.

A decompression control unit particularly suited for this kind of memory testing includes a first counter set up to generate at least the address bit of the assigned terminal of the address of at least one first memory cell the content of which is held constant during a test cycle; and a second counter set up to generate at least the address bit of the assigned terminal of the address of at least one second memory cell the content of which is varied during a test cycle.

That is, the first counter generates the address of the home cell(s), whereas the second counter generates the address of the away cell(s). If we take the first example with a single home cell, the first counter (which points to the home cell) will thus have a long period, and the second counter (which points to the away cells) will have a short period. The first counter will be held at a constant value, whereas the second counter counts through all cells of the memory. As soon as the second counter approaches the last cell in the memory, it is reset, whereas the first counter is increased by one thus defining the next home cell, and so on.

The whole process runs under control of the sequencer, which may start, stop and control the two counters, e.g. by controlling the "HOLD/RUN" inputs of the counters, their preset inputs or their clock inputs. As an alternative, the counters may (at least partially) also control each other; in the above-described example, the second counter could e.g. provide a carry bit which would increment the first counter.

This embodiment incorporating two counters is particularly effective upon memory testing, because the counters remove most of the time-consuming "standard" work (multiple address generation) from the sequencer and thus increase its operating speed considerably.

It may also be useful to provide a third counter which is set up to count coincidences between said first and second counter. The above example shows that the second counter (counting the away cells) should not address the home cell, in order not to destroy its contents. Thus, there is a necessity to skip one address in the cycle. The third counter, with a period of (N+1), may provide the necessary information therefore; that is, as soon as it has reached its final state, the sequencer will disregard one address generated by the second counter (preferably, by simple not advancing the corresponding vector to a buffer). It will be understood that this is functionality which could also be provided by the sequencer; however, use of a third counter is more effective and illustrates once more the outstanding advantages of the present invention.

The above discussed $N^2$-pattern is quite effective in testing; however, it may lead to considerable test times (sometimes exceeding one hour per memory). Thus, other patterns—which need less time for processing—should be regarded as well. One important groups of these patterns is the so-called "$N^{3/2}$-pattern". It is based on the finding that it may be sufficient (without considerable loss of performance) to keep to the "home cell" approach, but use only cells in the same row or column as away cells. A specific example of this group, the butterfly pattern, will now be discussed in greater detail.

Starting with the home cell, the first away cells tested are—by definition—the memory cells closest to the home cell and in the same row or column as the home cell. These are four cells. In the second step, the distance to the home cell is increased by 1, resulting in four further away cells, and so on. This pattern is usually processed in clockwise or counter-clockwise direction and requires to test $2 \cdot (\sqrt{N}-1)$ away cells (assuming a "square" memory). As the process is continued N times (for N home cells), we end up with a total of $2 \cdot (\sqrt{N}-1) \cdot N = 2 \cdot N \cdot \sqrt{N} - 2 \cdot N = 2 \cdot N^{3/2} - 2 \cdot N$ test cycles.

A counter structure of the decompression control unit is also suited to produce the addresses of such a butterfly pattern (and any other kind of $N^{3/2}$-pattern). in particular, one counter can be used as a row counter, and the other as a column counter, if they are set to different periods (because each row/column has another assigned weighting).

In order to increase speed further, a slightly modified counter structure may advantageously be used. In this concept, one counter is set up as "home counter" which points to the home cell. Two away counters operate in "increment" and "decrement" mode for the assigned row, i.e., they represent an offset with regard to the home cell. Their contents may be fed to the sequencer, in order to calculate the actual address of the away cells in the same row as the home cell. However, speed may further be increased by the provision of external adders which add the contents of the "home" counter and the "away" counters, respectively. The same structure (two away counters, adders) may be repeated for the column assigned to the home cell.

The present invention also relates to a method for testing an electronic device.

BRIEF DESCRIPTION OF THE DRAWINGS

The invention will now be explained, by means of a non-limiting example, with reference to the accompanying drawings, in which.

DETAILED DESCRIPTION OF THE PREFERRED EMBODIMENTS

Figure 1:
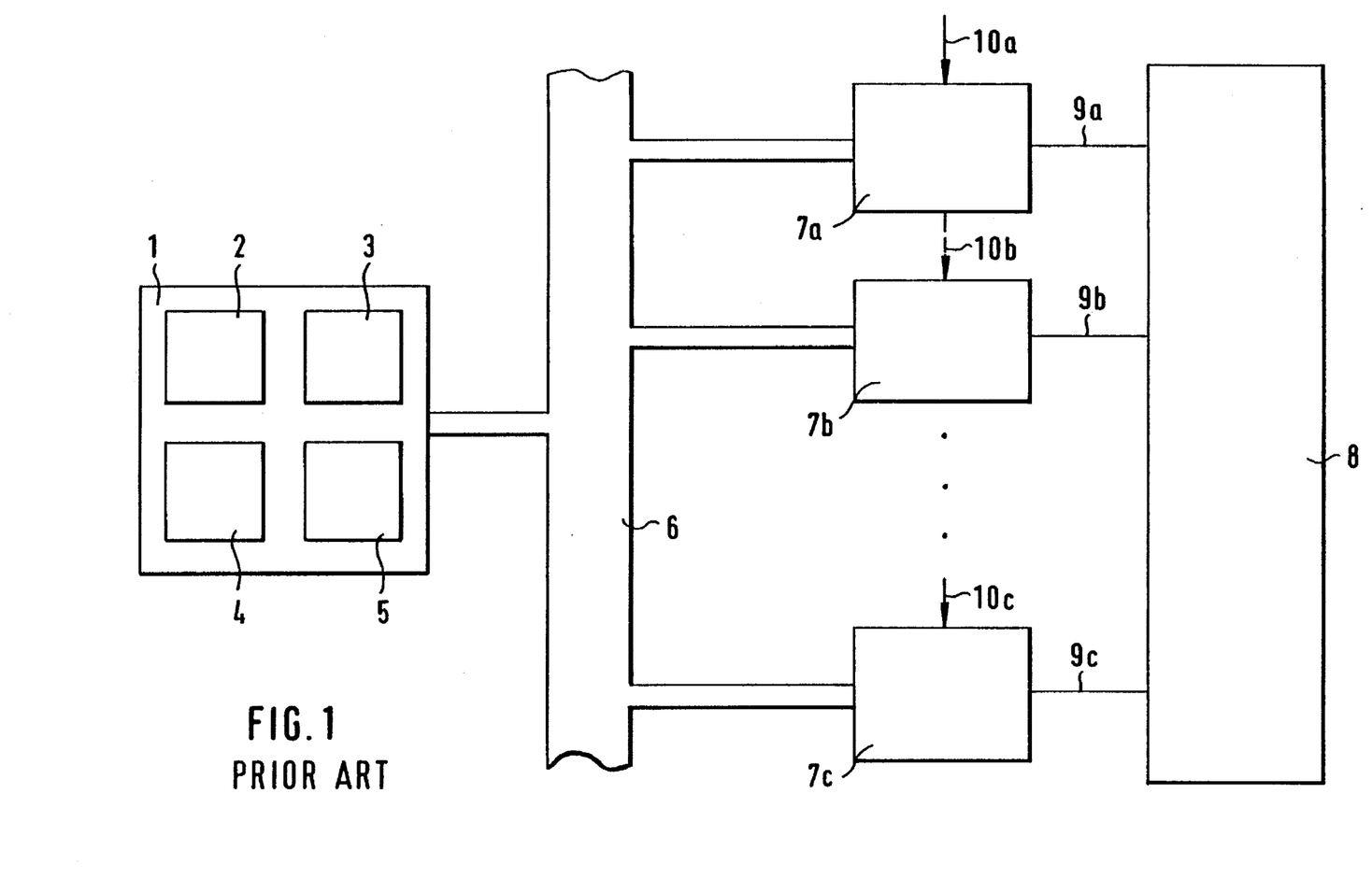
FIG. 1 is a structural diagram of a prior art memory tester.

The prior art memory tester shown in FIG. 1 includes an algorithmic pattern generator (APG) 1 which serves as a common resource for a multiplicity of pin circuits. In the embodiment of FIG. 1, APG 1 consists basically of four functional units. One is an x address generator 2, the second is a y address generator 3, block 4 represents the data generator, and block 5 the controller. Address generators 2 and 3 are provided for addressing a certain cell of the memory under test, whereas data generator 4 produces the data to be stored under the addressed memory cell. Functional block 5 controls operation of the address generators and the data generator. The output signals of APG 1 are fed to a common bus 6. The bus is connected with a multiplicity of pin channels or pin circuits, represented in FIG. 1 by pin boards 7a, 7b and 7c. It will be understood that three pin boards have been drawn for purposes of illustration only, whereas a real memory tester would include several hundred, or even several thousands of pin boards.

Every pin board 7a, 7b, 7c and so on communicates with a single pin of a device under test (DUT) 8 which is, in the example of FIG. 1, a memory. Three of the pin connections are labelled in FIG. 1 as 9a, 9b and 9c.

The major purpose of pin boards 7a to 7c is to link the information received via common bus 6 with timing signals usually received from edge generators, as indicated by arrows 10a, 10b and 10c. The pin boards include circuitry to link information received from APG 1 with timing information (formatter circuits), as well as circuitry designed to test the correct timing, and the correct logic state, of signals received from DUT 8 (comparator circuits).

Algorithmic pattern generator 1 is a very complex and expensive unit. This is the reason why a single APG is provided for all of the pin boards (shared resource approach). This limits testing speed considerably. It will further be noted that the pin boards 7a to 7c may be different, dependent on the functionality of the assigned pin of DUT 8 (i.e., whether this pin is an address pin, a data pin or a control pin). Thus, a complex and time-consuming rearrangement of the pin boards and their interconnection is necessary as soon as the pin definition of DUT 8 is changed. This is the reason why the structure shown in FIG. 1 is mainly suited to test memories of the same kind.

Figure 2:
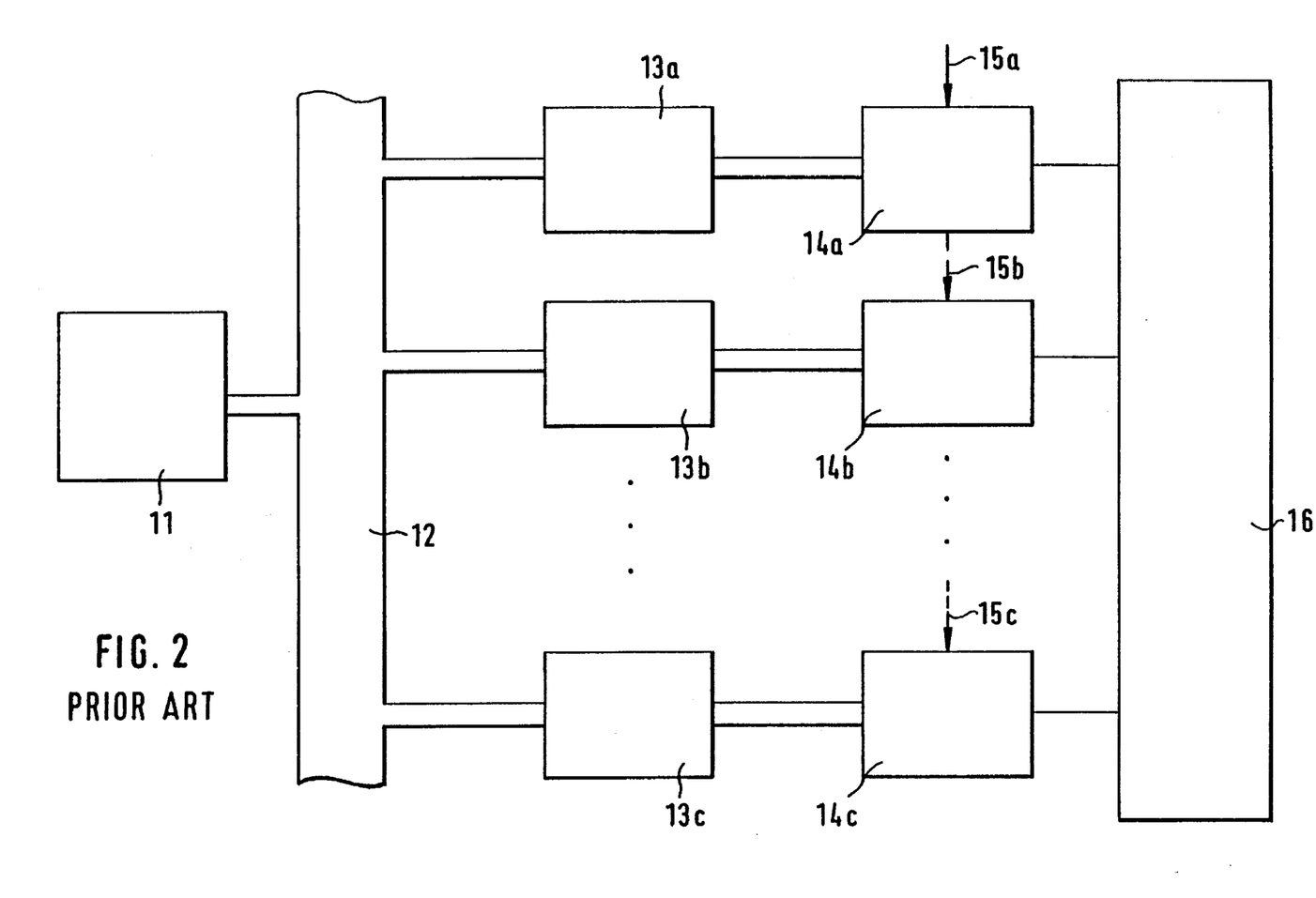
FIG. 2 depicts the structure of a prior art logic tester using the "shared resource" approach.

FIG. 2 depicts another approach of a prior art IC tester, namely a logic tester. This logic tester is also based on the "shared resource approach".

A sequencer 11 generates vector addresses which are fed, via a common bus 12, to the various pin channels or pin boards. Sequencer 11 is, in functional terms, a counter; however, it comprises additional circuitry such that it is able to perform jumps, subroutines and the like. In fact, sequencer 11 may also include a memory which defines some kind of program to be executed by the sequencer.

Anyway, it will be noted that sequencer 11 is of essentially simpler structure than the APG used in memory testing.

The output signals of sequencer 11 are fed, via bus 12, to vector memories 13a, 13b and 13c assigned to the pin channels (again, it will be noted that an actual logic tester will contain hundreds or even thousands of such pin channels). The vector memory decodes basically the address received from sequencer 11 into a status information, or actions, to be performed by the assigned pin of DUT 16 (in this case, a logic circuit).

The outputs of vector memories 13a to 13c are fed to formatter/comparator circuitry 14a to 14c. These receive timing signals (arrows 15a to 15c).

A more sophisticated approach is the additional provision of a waveform memory between every vector memory and the assigned formatter/comparator circuit. Such a waveform memory, as disclosed in European patent application . . . (application number 91119189.8) allows to decode a variety of possible actions and thus increases the test spectrum.

It will be noted that the logic tester shown in FIG. 2 is less complex than the memory tester discussed in the preceding figure. This does not only apply to the sequencer which is not as complex as the APG of a memory tester; it will also be noted that a logic device under test (DUT 16) does not comprise address pins and data pins, such that a complex rearrangement of the pin boards is not necessary. By the way, vector memory 13a will usually be incorporated on the same pin board as formatter/comparator circuitry 14a, as is the case for all other vector memory-formatter/comparator combinations.

Basically, the design shown in FIG. 2 is subject to the same or similar constraints in timing as the memory tester shown in FIG. 1. However, as the sequencer required for logic testing is of less complicated design, it is possible—at reasonable cost—to provide a single sequencer for every pin of the device under test.

Figure 3:
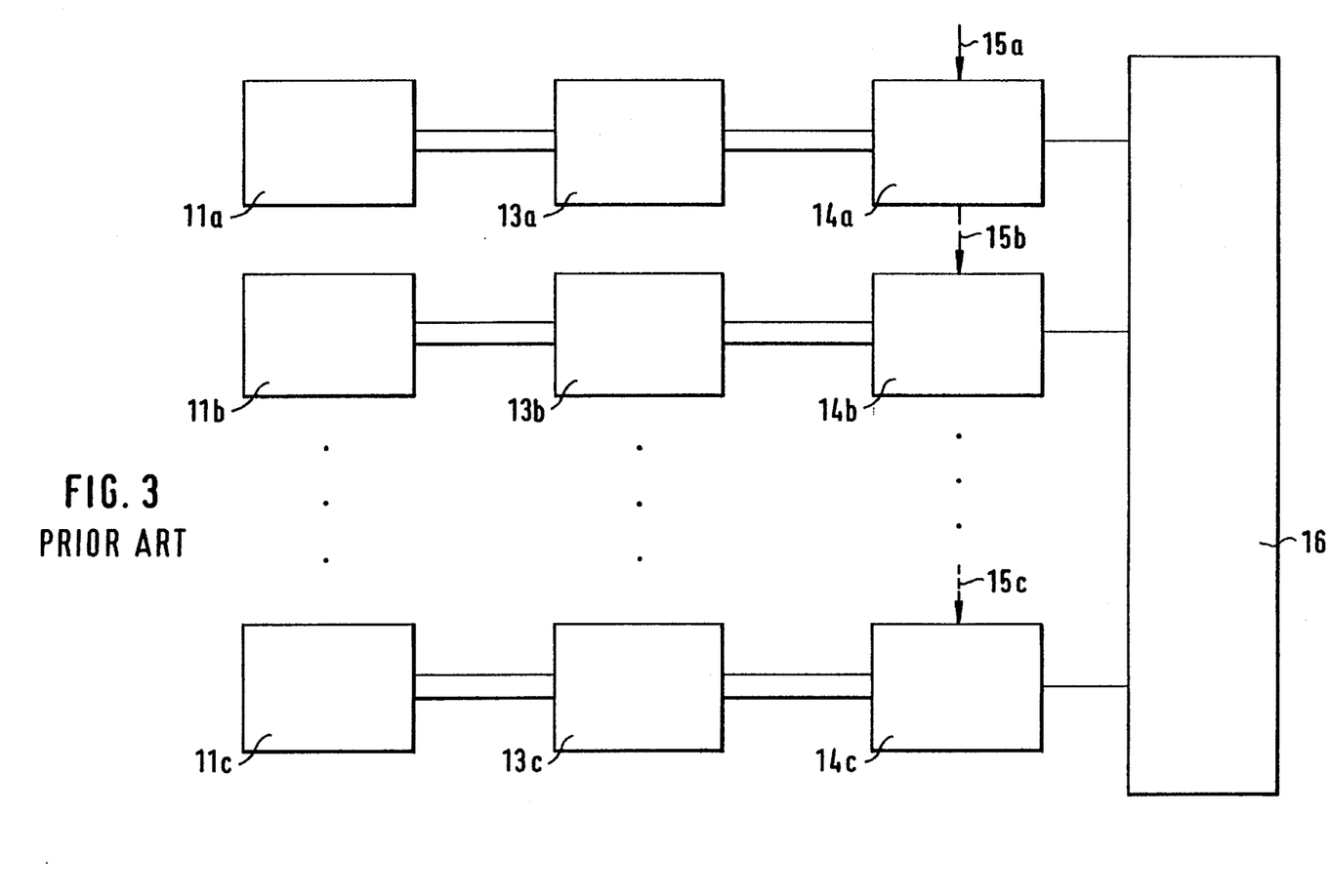
FIG. 3 shows another prior art logic tester based on the "per pin" architecture.

This approach, also called "per pin approach", is depicted in FIG. 3. The logic tester shown in this figure includes a multiplicity of sequencers 11a, 11b and 11c, all assigned to a specific pin channel. The remaining components of the tester shown in FIG. 3 are basically identical to the tester of FIG. 2 and have thus been assigned the same reference numbers.

The overall architecture of a memory tester, or a combined logic/memory tester according to the present invention will now be explained by means of FIG. 4.

The invention features a "per pin" approach wherein each pin channel includes a sequencer 17a, 17b, 17c; a decompression control unit 18a, 18b, 18c; a vector memory 19a, 19b, 19c; and formatter/comparator circuitry 20a, 20b, and 20c. The DUT 21 may be a memory, or an integrated circuit incorporating logic and memory functions, such as an ASIC. DUT 21 may basically have any arbitrary pin configuration; in particular, there is no need to adapt a pin channel to an address pin, data pin or control pin. In other words, no hardware reconfiguration is necessary if the pin definition changes between various DUTs, or even if the pin channel definition changes during operation.

Every sequencer or sequence controller 17a, 17b and 17c also includes an instruction memory 172', 17b' and 17c', as well as a buffer (first-in-first-out memories 17a", 17b" and 17c").

A central controller 22 is connected with the various pin channels, either directly or via a common bus 23.

It will be understood that the per pin circuitry—such as sequence controller 17a, decompression control unit 18a, vector memory 19a and formatter/comparator circuitry 20a—will usually be incorporated on a single printed circuit board, also called "pin board". Likewise, a Waveform memory (such as discussed above) may be incorporated between buffers 17a" to 17c" and formatter/comparator circuits 20a to 20c, respectively. The timing signals fed to the formatter/comparator circuits 20a to 20c are labelled as 24a, 24b and 24c in FIG. 4.

In operation, sequencers 17a to 17c feed control instructions to decompression control units 18a to 18c via lines 25a to 25c. The expanded or decompressed signals (which were generated by decompression control units 18a to 18c) are fed back to the sequencers via lines 26a to 26c.

Let us now consider one specific case of pin definition, in order to explain overall operation of the inventive integrated circuit tester. For purposes of illustration, we assume that pins 27a and 27b of DUT 21 are defined as address pins, whereas pin 27c is defined as a logic pin. In other words, DUT 21 includes a memory as well as additional logic circuitry. (It is evident that DUT 21 will also include data pins, and that further pins, like analog pins, may be provided as well. These pins may be controlled by similar pin circuitry as shown in FIG. 4; however, for graphical purposes, only two address pins, and a logic pin, are shown in the example of FIG. 4.)

Central controller 22 will now use the overall test program for the memory portion of DUT 21 to generate pin-designated subprograms which are fed, via common bus 23, to the instruction memories 17a' and 17b' of sequence controllers 17a and 17b, respectively. That is, the instructions fed to instruction memory 17a' are different from the instructions fed to instruction memory 17b', dependent on the weighting of the assigned address pin. Sequence controllers 17a and 17b will provide suitable control information to decompression control units 18a and 18b (via lines 25a and 25b). The control information will cause decompression control units 18a and 18b to generate pin-specific decompressed signals, e.g. addresses, in sequence and feed them, via lines 26a and 26b, to sequence controllers 17a and 17b.

The sequence controllers generate internally a first sequence of vectors. The shown example depicts sequence controllers which even generate two subsequences which together constitute said first sequence. Referring, for example, to sequence controller 17a, two boxes 28a and 28a' illustrate the generation of the two sub-sequences of said first sequence of vectors. The signal fed back from decompression control unit 18a on line 26a moves either sub-sequence to an internal buffer 29a, by operating a (hardware or software) multiplexer 30a.

This structure has been chosen for illustrative purposes only and shows the operation of a "conditional operand". That is, either of the two sub-sequences generated in boxes 28a and 28a' is moved to box 29a, dependent on the condition set by decompression control unit 18a.

Similar sub-sequences of vectors are generated in boxes 28b, 28b', 28c and 28c'; their outputs are, via multiplexers 30b and 30c, fed to "output" boxes 29b and 29c.

It is further understood that other logical connections between the first sequence of vectors and the second sequence of vectors 29a and 29c are possible; that is, the conditional vector processing means need not necessarily be in the form of a multiplexer as illustrated by multiplexers 30a to 30c. In contrast, the conditional vector processing means may basically be any logic circuitry which connects the first sequence of vectors with the output signals of the decompression control unit, in order to generate a second sequence of vectors. Also, a multiplexer or equivalent means may be provided with a multiplicity of inputs, instead of the two inputs per multiplexer shown in FIG. 4.

In general, sequence controllers 17a and 17b generate a train of signals which are fed to vector memories 19a and 19b. The vector memories may also be loaded by central controller with pin-specific data, as indicated by lines 31a, 31b and 31c. The address patterns are fed back to the sequence controller and, from buffers 17a" and 17b" via formatter/comparator circuits 20a and 20b, to pins 27a and 27b of DUT 21.

At the same point in time, sequence controller 17c generates logic signals. Decompression control unit 18c runs idle, or may be used to generate specific vector trains required for logic testing. For example, decompression control unit 18c may generate a train of address signals required in the process of addressing vector memory 19c.

It will be noted that the programs executed by the sequence controllers assigned to address pins are different among each other, whereas the programs executed by sequence controllers assigned to logic pins are all the same. In the latter case, only the contents of the respective vector memories are different. It will be understood that further pin channels may be assigned to data pins, i.e., they provide the data for the memory cells addressed by the two upper channels in FIG. 4. In similar manner, it will be possible to test a pure memory, in which case some pin channels will generate address signals, whereas others will generate data, but no logic channels will be provided. It is a particular advantage of the invention that the same pin channels (pin boards) can be provided for all kinds of pin definition, as every pin channel may be reconfigured during operation. For example, assume that DUT 21 changes its pin definition during test in that pin 27a is redefined from an address pin to a data pin. In such case, central controller 22 will simply switch between program modules already downloaded in advance in instruction memory 17a' of sequence controller 17a, such that it can serve as a data pin controller, and operation can immediately continue. This is a reconfiguration of the pin definition "on the fly", i.e., without the necessity to download new instructions. The same procedure is followed if another DUT with a different pin definition is inserted. (Of course, one may also download new instructions into instruction memory 17a' to obtain the same result, but this requires additional time and is therefore the less preferred approach.)

Central controller 22 may not only provide instruction codes to memories 17a' to 17c', or to vector memories 19a to 19c. Instead, it may also control the overall timing of the tester, e.g., ensure that the sequence controllers assigned to address pins start their operation at the same point in time when data pin channels become active.

Figure 5:
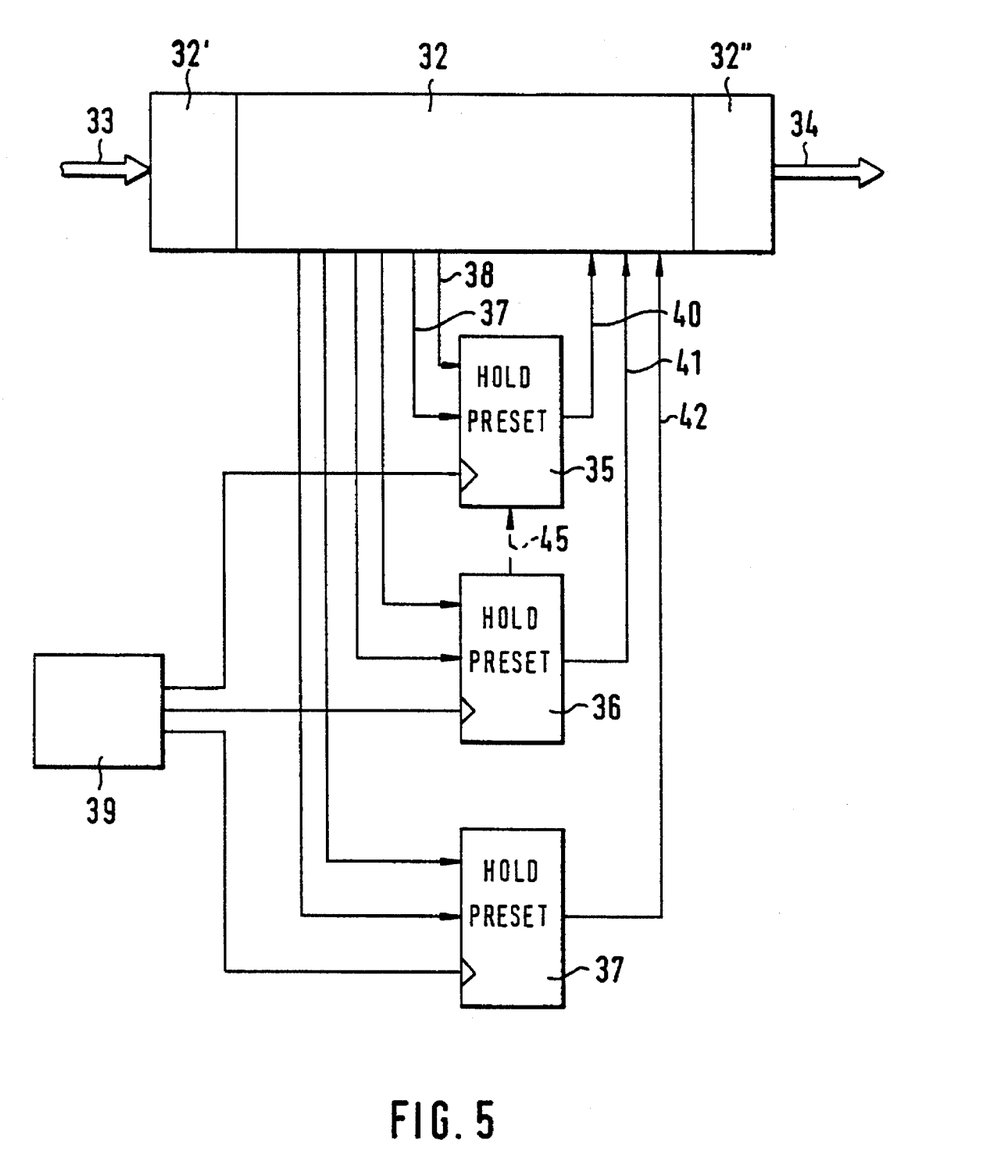
FIG. 5 shows a pin circuitry according to the invention in greater detail.

FIG. 5 depicts part of a pin circuitry in greater detail. In particular, it shows one preferred embodiment of a decompression control unit.

Figure 4:
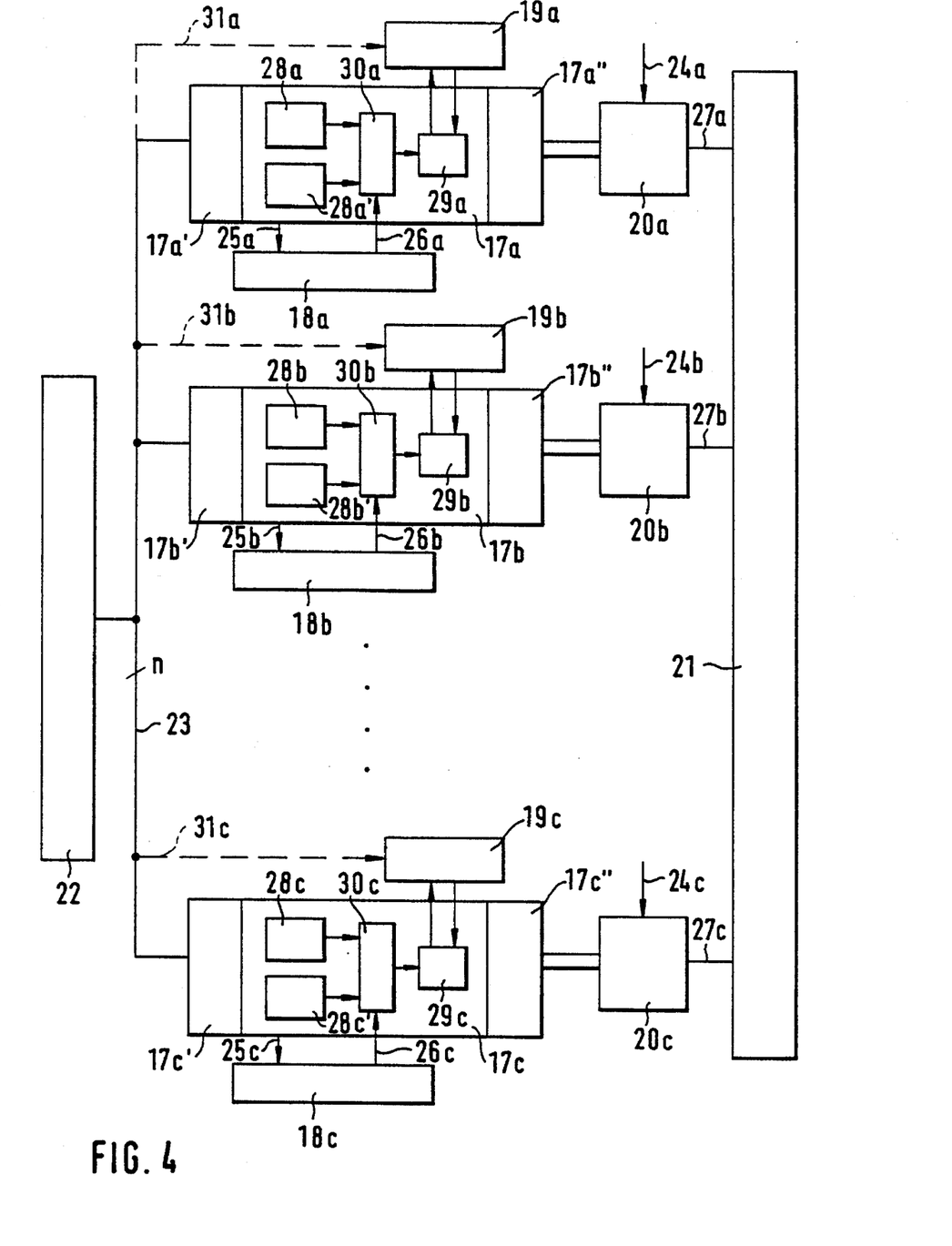
FIG. 4 depicts the overall embodiment of a tester according to the present invention.

Sequencer 32, and its instruction memory 32' as well as its buffer 32", correspond basically to the sequence controllers shown in FIG. 4. Information from the central controller is received via line 33; the vector output is labelled as 34. The components succeeding sequence controller 32 in a pin channel are not drawn in FIG. 5.

The decompression control unit consists, in the embodiment of FIG. 5, basically of three counters 35, 36 and 37. Their operation is controlled by the sequence controller 32; for example, sequence controller 32 controls the "HOLD/RUN" input (line 38) and the "PRESET" input (line 37) of counter 35. The other counters are controlled accordingly.

Although there is some external control concerning counters 35 to 37 (in particular, control of the start-up and boundary conditions), the counters are themselves free-running. That is, once they have received the necessary startup control codes, they will continue their operation on their own. Usually, they will receive a separate clock signal therefor, see clock generator 39 in FIG. 5. In certain cases, it may also be advisable to have some clock cycles directly controlled from the sequencer 32; in this case, the clock output of the sequencer, as well as the clock output of clock generator 39, will be fed to the inputs of a multiplexer, the output of which will be fed to the corresponding clock input of one of the counters.

The addresses generated by counters 35 to 37 are fed, via lines 40, 41 and 42, to sequence controller 32. The sequence controller may link these addresses (which will usually be 1-bit addresses) with other control information, as explained above, or feed them directly to line 34.

Figure 6:
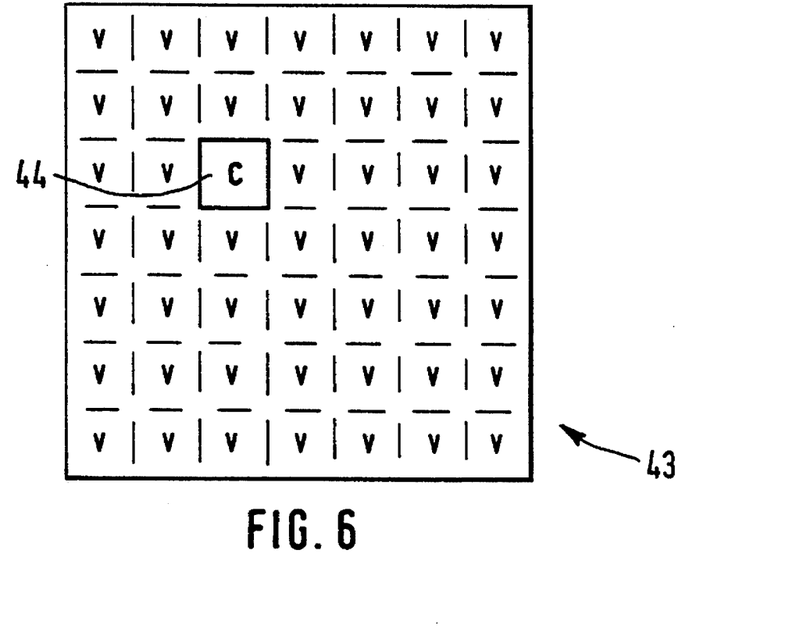
FIGS. 6 and 7 are diagrams illustrating operation when a memory is tested with an $N^2$-pattern.
Figure 7:
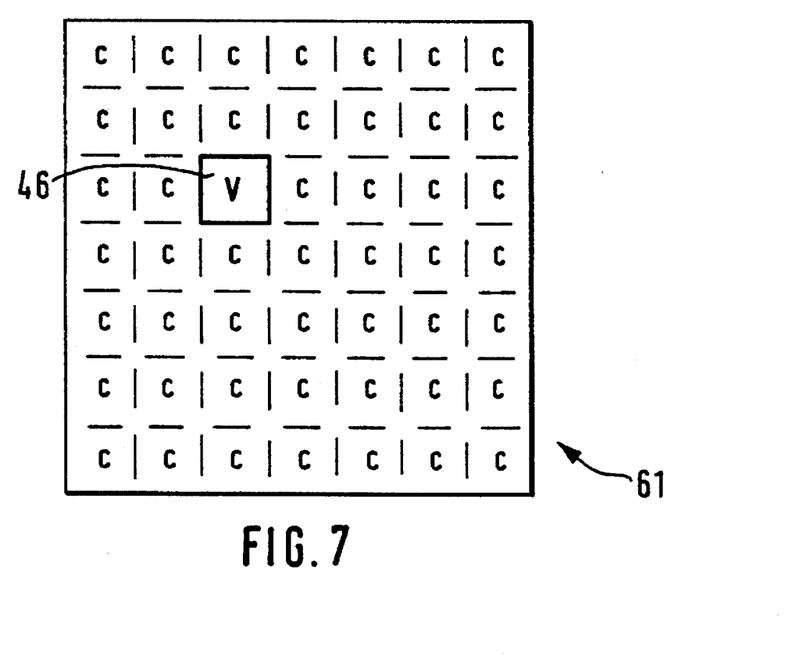

The counter structure of FIG. 5 is particularly suited to generate the addresses for memory test patterns as shown in FIGS. 6 and 7. FIG. 6 depicts schematically a memory 43, in this case—for the sake of simplicity—consisting of 7×7 memory cells. The test is performed in that the content of one cell 44 is held constant, whereas the contents of all other cells are variable, as indicated by the character "v". The test reveals whether any transition in any cell of the memory except cell 44 influences the contents of the latter cell. In the terms used herein, cell 44 is designated as "home cell", whereas the other cells are denominated as "away cells". A complete test cycle consists of defining every cell of the memory as home cell, and of varying all away cells for every specific home cell. Thus, the number of test cycles necessary is proportional to $N^2$, such that this kind of test is also known as "$N^2$-test".

The decompression control unit shown in FIG. 5 is perfectly suited to produce the addresses required for such an $N^2$-test. For example, counter 35 may point to the home cell, and counter 36 to a specific away cell. Counter 35 holds its value for a specific home cell, whereas counter 36 runs through all cells of the memory. When counter 36 has reached its final state, it will be reset, and counter 35 will be incremented by one, thus pointing to the next home cell. This increment can be done by control logic incorporated in sequence controller 32, or even directly by feeding a carry bit of counter 36 to counter 35, as indicated by dotted line 45. The away counter 36 runs then again from 0 to its final state (or vice versa). The whole process is continued until all cells in the memory have acted as home cells.

Additional address information is provided by counter 37. One will note that away counter 36 should, during one cycle, point to all cells of memory 43 except the home cell 44 itself (as it would otherwise destroy the contents of the home cell). Thus, there is a need to skip one address in the memory. Although this task could be performed by internal control logic in sequence controller 32, it is easier to use an additional counter (namely counter 37) which causes sequence controller 32 to remove an address vector whenever the away counter points to the home cell. If that happens, sequence controller 32 simply does not advance the related address vector to buffer memory 32". It is understood that counter 37 will run with a period of (N+1), wherein N is the total number of memory cells. In the example of FIG. 6, the period will be 50.

FIG. 7 shows another $N^2$-pattern which is somewhat the reverse of the pattern shown in FIG. 6. In this concept, all cells in memory 61 are held constant with the exception of a cell 46 the contents of which are varied (character "v"). In other words, the pattern in FIG. 7 includes (N−1) home cells, and a single away cell. It is evident that the three-counter structure of FIG. 5 is also suited to fit the needs of the test illustrated in FIG. 7.

Figure 8:
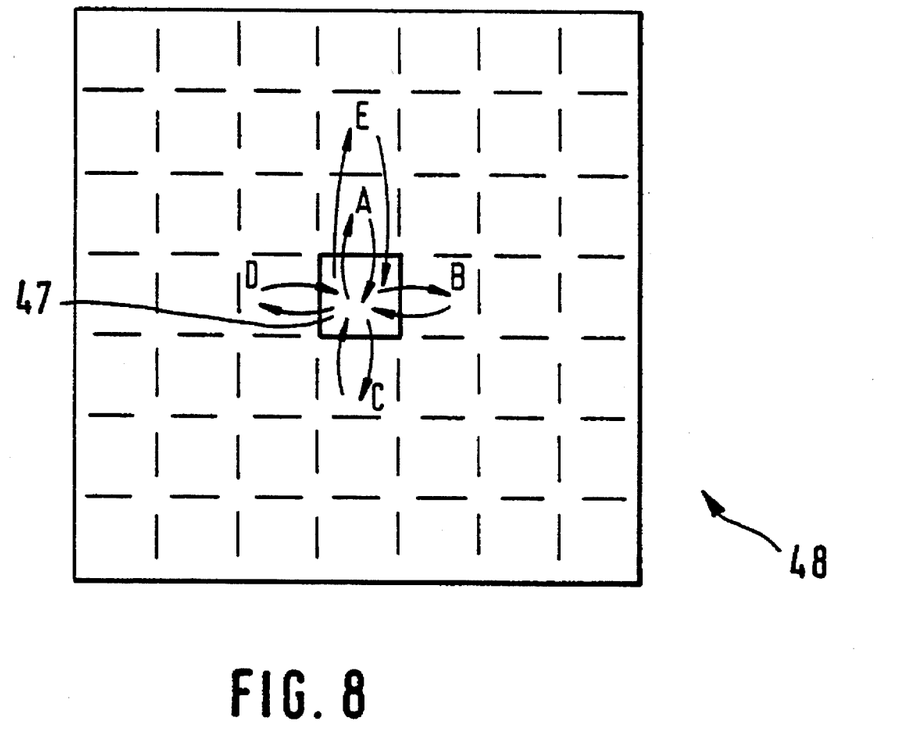
FIG. 8 depicts an $N^{3/2}$-pattern, namely the butterfly pattern.

Yet another test pattern—which is suited to test memories at a higher speed than the $N^2$-pattern—is shown in FIG. 8. This is the so-called "butterfly pattern". Again, a cell 47 in memory 48 is defined as "home cell". However, the away cells varied are only cells which are either in the same row, or in the same column as home cell 47. The test usually starts with the four cells next to the home cell, and in the same row or column as the home cell. In the second step, the distance to the home cell is increased by one, and so on. Most commonly, the test is performed in clockwise or counter-clockwise direction. FIG. 8 depicts the example of a clockwise test. That is, the first array cell is the cell just above the home cell, as indicated by character "A". Cells B, C and D are the next cells to be varied. The distance to the home cell is then increased by one, as indicated by cell E, and so on.

It will be noted that the resulting pattern looks somewhat like a butterfly. The butterfly pattern is one specific example of the so-called "$N^{3/2}$-tests", as the number of required test cycles is proportional to $N^{3/2}$.

Figure 9:
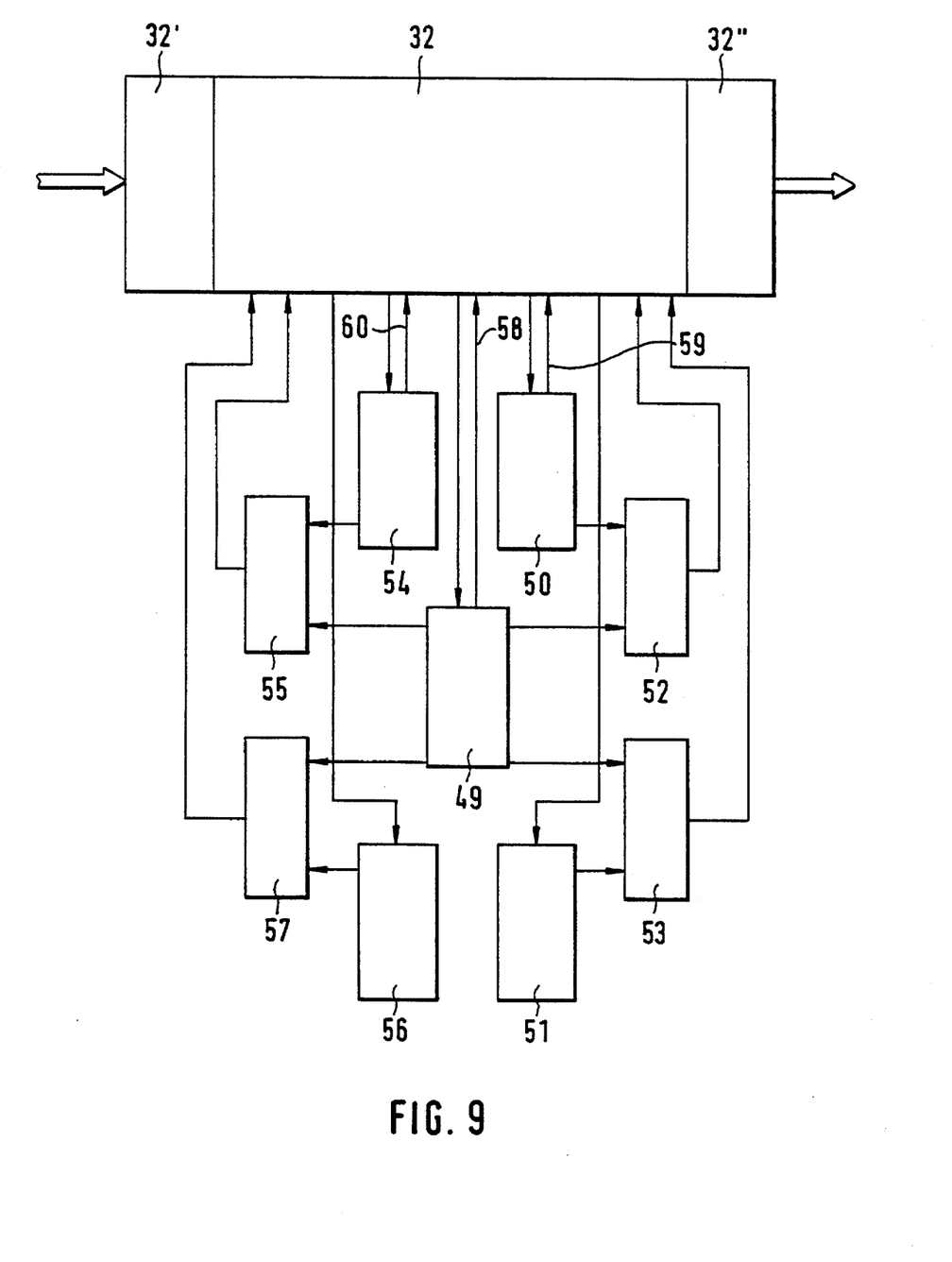
FIG. 9 shows a pin circuitry specifically adapted to perform an $N^{3/2}$-pattern.

FIG. 9 depicts a somewhat modified counter structure of the decompression control unit adapted to support N3⁄2-test patterns. Sequence controller 32, its instruction memory 32' and buffer 32" are the same as in the embodiment of FIG. 5.

Counter 49 points to the home cell (see reference number 47 in FIG. 8). Counter counts an offset increment with respect to the row in which the home cell is located. Similarly, counter 51 counts down (decrements) in the row of the home cell.

The output of home cell counter 49 is fed, together with the output of row increment counter 50, to an adder 52. The output of this adder is, in turn, fed back to the sequence controller. The vector such received by the sequence controller points subsequently to all cells right of the home cell (e.g., cell B in FIG. 8).

Likewise, adder 53 adds the contents of home cell counter 49 and of row decrement counter 51, such that all away cells left from the home cell (such as cell D in FIG. 8) are addressed.

This structure is repeated for the column cells. In particular, counter 54 is a column increment counter, such that adder 55 produces an address which points to all away cells above the home cell (cells A, E in FIG. 8). Column decrement counter 56 feeds its output to adder 57, which produces a vector pointing to all memory cells below the home cell (cell C in FIG. 8).

It is understood that the provision of adders 52, 53, 55 and 57 is not a necessary prerequisite for practicing the present invention. The adding function is something which could also be provided by sequence controller 32. However, the adders increase processing speed further.

The architecture shown in FIG. 9 may be used to support the above-described $N^2$-test as well. For example, counters 49, 50 and 54 could be used to provide the three addresses necessary therefor. Thus, they have also a direct feedback to sequence controller 32, as shown by lines 58, 59 and 60.

As an alternative, it is also possible to remove counters 54 and 56, as well as adders 55 and 57, and have the remaining counters 49, 50 and 51 operate as row and column increment/decrement counters, respectively. This can easily be done by reprogramming them, and saves hardware components; thus, it is in fact the presently preferred approach. In the remaining structure, counters 49, 50 and 51 would have a direct feedback, i.e., a duplex connection, with sequence controller 32, in order to support the $N^2$-test as well (this is different from FIG. 9 which depicts no direct feedback from counter 51 to sequence controller 32). This alternative structure is thus quite similar to the embodiment of FIG. 5, but includes additional adders 52 and 53.

We claim:

1. A test vector generator for generating a test vector used for testing an electronic device having a memory or a logic/memory combination and a plurality of terminals, said terminals including at least:

a first subset of said terminals, at least temporarily operative as address terminals, a second subset of said terminals at least temporarily operative as data terminals, wherein said test vector generator comprises:

at least one terminal channel assigned to said terminals or to a specific set of terminals, said terminal channel comprising:

a sequence controller for generating a first sequence of vectors, at least one decompression control unit which is controlled by said first sequence of vectors generated by the sequence controller, generates plural subsequent decompression signals based on each vector of said first sequence of signals and feeds them to the sequence controller, wherein said sequence controller further includes conditional vector processing means for generating a second sequence of vectors by logically combining said first sequence of said vectors with the decompressed signals received from the decompression control unit, and for applying the second sequence of vector to said terminal or to said specific set of terminals.

2. Apparatus according to claim 1, wherein said decompression control unit expands control signals received from said sequence controller to decompressed signals of higher information content.

3. Apparatus according to claim 2, wherein said decompression control unit operates basically independent of said sequence controller once it has received said control signals.

4. Apparatus according to claim 1, wherein said conditional vector processing means executes instructions with a conditional operand, and wherein the condition of said conditional operand is set by said decompressed signals received from said decompression control unit.

5. Apparatus according to claim 1, wherein said sequence controller includes an instruction memory.

6. Apparatus according to claim 5, wherein said electronic device has a multiplicity of terminals and a variety of terminal channels which are assigned to at least several of said terminals, and wherein said apparatus includes a central controller which is connected with essentially all of said sequence controllers and controls the contents of each sequence controller's instruction memory.

7. Apparatus according to claim 6, wherein said central controller is adapted to load each sequence controller's instruction memory with instructions specifically dedicated to its assigned terminal.

8. Apparatus according to claim 7, wherein said central controller is set up to generate different instructions from an overall test procedure for every assigned terminal.

9. Apparatus according to claim 1, wherein said electronic device is an integrated circuit, and said apparatus is an integrated circuit tester.

10. Apparatus according to claim 9, wherein said terminal is a pin of said integrated circuit.

11. Apparatus according to claim 9, wherein a terminal channel is provided for essentially all terminals of said first subset of terminals.

12. Apparatus according to claim 9, wherein said decompressed signals generated by said decompression control unit are decompressed addresses.

13. Apparatus according to claim 9, wherein said electronic device includes logic circuitry as well as at least one memory.

14. Apparatus according to claim 1, wherein said electronic device is a printed circuit board, and said apparatus is a board tester.

15. Apparatus according to claim 1, wherein said sequence controller is connected with at least one address input of at least one decoder memory.

16. Apparatus according to claim 1, including buffer means, in particular a first-in-first-out memory, at the output of said sequence controller.

17. Apparatus according to claim 1, including a formatter/comparator circuit interconnected between said sequence controller and said at least one terminal of said electronic device.

18. Apparatus according to claim 1, wherein said decompression control unit includes an address generator, in particular a one-bit address generator.

19. Apparatus according to claim 18, wherein said address generator includes counter means.

20. Apparatus according to claim 1, wherein said sequence controller is set up to generate vectors for logic pins, as well as memory pins, of an electronic device.

21. Apparatus according to claim 20, wherein said sequence controller is set up to operate in logic test mode, as well as memory test mode.

22. A test vector generator for generating a test vector used for testing an integrated circuit having a memory or a logic/memory combination and a plurality of terminals, said terminals including at least:

a first subset of said terminals at least temporarily operative as address terminals, and a second subset of said terminals at least temporarily operative as data terminals, said test vector generator being assigned to a specific terminal of said first subset of terminals of said integrated circuit, wherein said test vector generator comprises:

at least one terminal channel assigned to said terminal or to a specific set of terminals, said terminal channel comprising:

a sequence controller for generating a first sequence of vectors, at least one decompression control unit which is controlled by said first sequence of vectors generated by the sequence controller, generates plural subsequent decompressed signals based on each vector of said first sequence of signals and feeds them to the sequence controller, wherein said sequence controller further includes conditional vector processing means for generating a second sequence of vectors by logically combining said first sequence of vectors with the decompressed signals received from said decompression control unit;

a first counter set up to generate at least the address bit of the assigned terminal of the address of at least one first memory cell, the content of which is held constant during a test cycle; and a second counter set up to generate at least the address bit of the assigned terminal of the address of at least one second memory cell, the content of which is varied during a test cycle.

23. Apparatus according to claim 22, wherein said first counter is set up to generate new addresses only from test cycle to test cycle, and wherein said second counter is set up to generate new addresses in sequence.

24. Apparatus according to claim 22, wherein said second counter is set up to generate new addresses only from test cycle to test cycle.

25. Apparatus according to claim 22, wherein said sequence controller controls the hold and/or preset inputs of at least one of said first and second counters.

26. Apparatus according to claim 22, wherein said second counter includes a carry output and said first counter includes a start input, and wherein the carry output signal of the second counter is fed to the start input of the first counter.

27. Apparatus according to claim 22, including a third counter which is set up to count coincidences between said first and second counter.

28. Apparatus according to claim 22, including a fourth counter set up to count the increments of the address of a memory cell within a row with respect to a base cell, and further including a fifth counter set up to count the decrements of the address of said memory cell within a row with respect to said base cell.

29. Apparatus according to claim 28, including adding means connected to the outputs of said fourth and fifth counter, respectively.

30. Apparatus according to claim 28, including a second fourth counter set up to count the increments of the address of said memory cell within a column with respect to a base cell, and further including a second fifth counter set up to count the decrements of the address of said memory cell within a column with respect to said base cell.

31. Apparatus according to claim 30, including second adding means connected to the outputs of said second fourth and second fifth counter.

32. A method for generating a test vector used for testing an electronic device having a memory or a logic/memory combination and a plurality of terminals, said terminals including at least a first subset of terminals at least temporarily operative as address terminals and a second subset of terminals at least temporarily operative as data terminals, said method comprising the steps of:

generating a first sequence of vectors, generating plural subsequent decompressed signals based on each vector of said first sequence of signals, generating a second sequence of vectors by logically combining said first sequence of vectors with the decompressed signals, and applying the second sequence of vectors to said terminals or to said specific set of terminals.

33. Method according to claim 32 wherein sequence controllers are provided for a multiplicity of terminals of said electronic device, including the steps of generating instructions specific for each terminal from an overall test procedure, and feeding said instructions to memories incorporated in said sequence controllers.

* * * * *